United States Patent
Fromson et al.

(10) Patent No.: US 7,816,065 B2
(45) Date of Patent: Oct. 19, 2010

(54) IMAGEABLE PRINTING PLATE FOR ON-PRESS DEVELOPMENT

(75) Inventors: Howard A. Fromson, Stonington, CT (US); William J. Rozell, Vernon, CT (US); William J. Ryan, Enfield, CT (US); Paul A. Perron, Springfield, MA (US)

(73) Assignee: Anocoil Corporation, Rockville, CT (US)

( * ) Notice: Subject to any disclaimer, the term of this patent is extended or adjusted under 35 U.S.C. 154(b) by 121 days.

(21) Appl. No.: 11/493,183

(22) Filed: Jul. 26, 2006

(65) Prior Publication Data

US 2007/0026342 A1 Feb. 1, 2007

Related U.S. Application Data

(60) Provisional application No. 60/704,140, filed on Jul. 29, 2005.

(51) Int. Cl.
*G03F 7/00* (2006.01)
*C08F 2/00* (2006.01)

(52) U.S. Cl. ............... 430/270.1; 430/281.1; 526/72

(58) Field of Classification Search ............... 430/162, 430/165, 191, 270.1, 281.1, 343
See application file for complete search history.

(56) References Cited

U.S. PATENT DOCUMENTS

| | | | |
|---|---|---|---|
| 3,136,637 A | 6/1964 | Larwon et al. | |
| 3,867,150 A | 2/1975 | Ketley | |
| 3,904,412 A | 9/1975 | Serrien et al. | |
| 4,058,443 A | 11/1977 | Murata et al. | |
| 4,123,272 A | 10/1978 | Quinn | |
| 4,186,006 A | 1/1980 | Kobayashi et al. | |
| 4,229,520 A | 10/1980 | Bratt et al. | |
| 4,315,065 A | 2/1982 | Pigeon et al. | |
| 4,329,422 A | 5/1982 | Langlais | |
| 4,370,406 A | 1/1983 | Jones | |
| 4,391,940 A * | 7/1983 | Kuhls et al. | 524/458 |
| 4,468,453 A | 8/1984 | Nakamura et al. | |
| 4,533,620 A | 8/1985 | Walls et al. | |
| 4,562,142 A | 12/1985 | Kakumaru et al. | |
| 4,563,410 A | 1/1986 | De Jaeger et al. | |
| 4,645,730 A | 2/1987 | Fromson et al. | |
| 4,708,925 A | 11/1987 | Newman | |
| 4,956,261 A * | 9/1990 | Pawlowski et al. | 430/156 |
| 5,141,841 A * | 8/1992 | Wade | 430/281.1 |

(Continued)

FOREIGN PATENT DOCUMENTS

WO    WO 02051639 A2 *  7/2002

*Primary Examiner*—Cynthia H Kelly
*Assistant Examiner*—Chanceity N Robinson
(74) *Attorney, Agent, or Firm*—Alix, Yale & Ristas, LLP

(57) ABSTRACT

A novel coating for lithographic printing plates can be imagewise exposed to radiation and then directly processed with only water to remove the non-exposed regions of the coating. The coating comprises a polymer, a monomer and/or oligomer, polymerization or cross link initiator, stabilizer, and dye or pigment, such that after imaging, the non-imaged resin areas are removable from the planar surface by penetration of water through the non-imaged coating without dissolution of the resin components of the coating, to form a lithographic printing plate with clearly defined image and non-image areas. The stabilizer is a solvent soluble, partially water soluble, non-polymerizable organic component that enables the coating to be removable by water in the non-cross linked areas.

10 Claims, 5 Drawing Sheets

U.S. PATENT DOCUMENTS

| | | | |
|---|---|---|---|
| 5,216,201 A | 6/1993 | Ohishi et al. | |
| 5,227,265 A | 7/1993 | DeBoer et al. | |
| 5,254,429 A * | 10/1993 | Gracia et al. | 430/162 |
| 5,260,180 A * | 11/1993 | Sahyun et al. | 430/542 |
| 5,319,422 A | 6/1994 | Ohishi et al. | |
| 5,337,113 A | 8/1994 | Kagawa et al. | |
| 5,344,731 A | 9/1994 | Deboer et al. | |
| 5,395,734 A | 3/1995 | Vogel et al. | |
| 5,480,752 A | 1/1996 | Nishikiori et al. | |
| 5,484,684 A | 1/1996 | Telser et al. | |
| 5,503,074 A | 4/1996 | Hirano et al. | |
| 5,506,090 A | 4/1996 | Gardner, Jr. et al. | |
| 5,552,260 A | 9/1996 | Vogel et al. | |
| 5,571,658 A | 11/1996 | Sonokawa et al. | |
| 5,698,361 A | 12/1997 | Aoshima | |
| 5,786,122 A | 7/1998 | Konrad et al. | |
| 5,871,883 A | 2/1999 | Hirano et al. | |
| 5,888,696 A | 3/1999 | Hirano et al. | |
| 5,925,490 A | 7/1999 | Loerzer et al. | |
| 5,939,237 A | 8/1999 | Gardner, Jr. et al. | |
| 6,228,559 B1 | 5/2001 | Oda | |
| 6,335,144 B1 | 1/2002 | Murota et al. | |
| 6,423,471 B1 | 7/2002 | Sorori et al. | |
| 6,468,711 B1 | 10/2002 | Sorori et al. | |
| 6,475,700 B1 | 11/2002 | Higashi et al. | |
| 6,569,603 B2 | 5/2003 | Furukawa | |
| 6,590,011 B1 * | 7/2003 | Rappoport et al. | 522/170 |
| 6,645,403 B1 * | 11/2003 | Park et al. | 252/570 |
| 6,686,127 B2 | 2/2004 | Sonokawa | |
| 6,689,537 B2 | 2/2004 | Urano et al. | |
| 6,723,495 B2 | 4/2004 | Ray et al. | |
| 6,727,044 B1 | 4/2004 | Fujimaki et al. | |
| 6,727,045 B2 | 4/2004 | Fuji | |
| 6,749,995 B2 | 6/2004 | Matsumura | |
| 6,841,336 B2 | 1/2005 | Kondo | |
| 6,878,505 B2 | 4/2005 | Shibuya | |
| 6,884,561 B2 | 4/2005 | Fromson et al. | |
| 6,899,994 B2 | 5/2005 | Huang et al. | |
| 6,899,998 B2 | 5/2005 | Figov | |
| 7,011,928 B2 | 3/2006 | Takamuki | |
| 7,041,429 B2 | 5/2006 | Ohta et al. | |
| 7,041,431 B2 | 5/2006 | Urano | |
| 7,189,494 B2 * | 3/2007 | Knight et al. | 430/281.1 |
| 2003/0054282 A1 * | 3/2003 | Fromson et al. | 430/165 |
| 2003/0186165 A1 | 10/2003 | Gries et al. | |
| 2003/0207202 A1 * | 11/2003 | Fujita et al. | 430/270.1 |
| 2005/0069811 A1 | 3/2005 | Mitsumoto et al. | |
| 2005/0123853 A1 | 6/2005 | Munnelly et al. | |
| 2005/0130064 A1 * | 6/2005 | West et al. | 430/281.1 |
| 2005/0266350 A1 | 12/2005 | Suzuki et al. | |
| 2006/0024614 A1 | 2/2006 | Williamson | |
| 2006/0046191 A1 | 3/2006 | Sakata | |
| 2006/0046199 A1 | 3/2006 | Mitsumoto et al. | |
| 2006/0188814 A1 | 8/2006 | Sakata | |
| 2006/0254738 A1 * | 11/2006 | Anderson et al. | 162/175 |
| 2007/0009829 A1 | 1/2007 | Teng | |
| 2007/0072127 A1 | 3/2007 | Teng | |
| 2007/0101886 A1 | 5/2007 | Teng | |
| 2007/0172765 A1 | 7/2007 | Teng | |
| 2007/0214987 A1 | 9/2007 | Sonokawa et al. | |

* cited by examiner

IMAGEABLE PRINTING PLATE FOR ON-PRESS DEVELOPMENT

RELATED APPLICATION

This application claims priority under 35 U.S.C. §119(e) from U.S. Provisional Application No. 60/704,140 filed Jul. 29, 2005, for "Imageable Printing Plate for On-Press Development".

BACKGROUND OF THE INVENTION

The present invention relates to the preparation of imageable lithographic plates, and especially to such plates as used for printing.

Plates of this type have a radiation-sensitive, oleophillic polymer resin coating on a hydrophilic substrate. After image-wise exposure at ultraviolet, visible, or infrared wavelengths, the plates are developed to remove the non-exposed regions of the coating, thereby producing a substantially planographic pattern of oleophillic and hydrophilic regions. The developed plates are then ready for mounting on a cylinder of a printing press, where the plates are subjected to fountain fluid and ink for transfer of ink to a target surface according to the pattern of oleophillic and hydrophilic regions on the plate.

SUMMARY OF THE INVENTION

The present innovation is that a novel coating for plates of this general type can be imagewise exposed to radiation and then directly processed with only water to remove the non-exposed regions of the coating.

As a consequence, unlike in conventional systems, with the present invention the plates can be delivered directly from the imager to the press, where fountain fluid "develops" the plates on-press. The non-imaged (non-exposed) regions quickly dislodge to reveal the underlying substrate, which has an affinity for fountain fluid, while the ink-receptive imaged regions are retained. The immersion of the plate in fountain fluid and the contact of the wet plate with a cylinder in the press removes the non-imaged regions without a distinct developing step, and without the need for monitoring or intervention. The resulting printing plates can be run in the conventional manner to produce the printed product. As an optional configuration, the imaged plates may be sent to a water processing station, where no special treatment is required other than contact with neutral water.

The most evident advantage is that no separate developing equipment or step is required between the imager and the press. A second significant advantage, whether or not the plate is passed through a water processor, is that there is little or no chemical treatment required of the waste stream associated with developing the plate. A third significant advantage is that because dissolution of the polymer resin is not relied upon for processing the plate, higher molecular weight resins can be used in the coating, thereby producing more durable oleophillic regions and longer plate life on press.

The invention is thus directed to a novel coating formulation, and to a coated plate having a novel imageable coating. A negative working, actinically and/or IR imageable coating is deposited from a solvent (non-aqueous) solution on a hydrophilic planar surface. The coating comprises a polymer, a monomer and/or oligomer, polymerization or cross link initiator, stabilizer, and dye or pigment, such that after imaging, the non-imaged resin areas are removable from the planar surface by penetration of water through the non-imaged coating without dissolution of the resin components of the coating, to form a lithographic printing plate with clearly defined image and non-image areas.

Coatings based on the present invention can comprise one or more components capable of cross linking by free radical polymerization. The polymerization arises as a result of exposure to the imaging radiation. The radiation absorbers and/or initiators facilitate the cross linking efficiency. The coatings also comprise a solvent soluble, partially water soluble, non-polymerizable organic component as the stabilizer that enables the coating to be removable by water in the non-cross linked areas.

In an alternative embodiment, the imageable coating is applied over a subcoating, and a topcoat is applied over the imageable coating. The top coat is typically a water soluble film former that serves to prevent atmospheric oxygen from diffusing into the coating and quenching the free radicals. The subcoat facilitates the release of the coating from the substrate in the non-imaged areas.

The presence of processing or fountain water on the plate coupled with the partial solubility of the non-polymerizable organic compound in the coating, produces paths in the non-imaged regions for the water to penetrate the surface. It is believed that fissures or the like form in the coating, enabling the film or layer of water on the surface of the coating to penetrate the coating, for example by one or more of seepage, percolation, or diffusion. The water appears to penetrate to the surface of the substrate, where it may spread laterally under the coating. The water penetration facilitates the release of the coating from the substrate.

In another embodiment, the invention is directed to a process for preparing a lithographic plate for offset printing. The steps include selecting a plate having a hydrophilic substrate and an overlying oleophillic, radiation sensitive coating, which coating cross links where exposed to radiation in a particular wavelength range, and imagewise exposing the plate to radiation in that particular wavelength range, thereby producing a pattern of cross linked, highly cohesive oleophillic regions and less cohesive oleophillic regions. The entire coating is then exposed to water, whereby water penetrates only the less cohesive regions to the substrate, undermining the adhesion of and completely dislodging these regions from the substrate to form a printing plate having an image pattern of cross linked, oleophillic regions of said coating and hydrophilic regions of the substrate.

In yet another embodiment, the invention is directed to a printing process in which the imaged plates are developed on press, in the presence of fountain fluid. These steps include selecting a plate having a hydrophilic substrate and an overlying oleophillic, less cohesive, radiation sensitive coating, which coating cross links where exposed to radiation in a particular wavelength range. The next step is imagewise exposing the plate to radiation in that particular wavelength range, thereby producing a pattern of cross linked oleophillic regions and less cohesive oleophillic regions. Without further treatment, the plate is mounted on a lithographic printing press cylinder. On press, the plate is subjected to a press fluid comprising at least one of water or fountain solution, whereby the water or fountain solution penetrates through only the less cohesive regions to the hydrophilic substrate. Contact of the coating with an opposed blanket cylinder pulls the less cohesive regions from the plate to form a printing plate having an image pattern of cross linked, oleophillic regions of the coating and hydrophilic regions of the substrate. At substantially the same time or shortly thereafter, ink is applied to the printing plate for transferring ink to the blanket cylinder and further transfer of ink to a target surface to be printed.

A key feature of the invention is the penetration of water through the non-imaged regions of the imaged plate, to dislodge these regions without weakening or deterioration of the cross-linked imaged regions. However, within that broad functionality, one of ordinary skill based on the following detailed description and examples, can vary several constituents of the coating to optimize imaging speed, wavelength sensitivity, strength of the cross linked, oleophillic, radiation-imaged regions, and ease of removal of the non-imaged regions to reveal the hydrophilic substrate. One basis for optimization, is whether the imaged plates will be processed in a water bath upstream of the press, or directly on-press. The non-imaged coating regions are generally more easily removed on press than in a bath with wiping, so the optimization for on-press processing can be biased toward higher molecular weight polymer resins, or higher ratio of polymer to monomer. If high imaging speed is the basis for optimization, a high monomer to polymer ratio is utilized, thereby promoting rapid cross linking upon exposure to imaging radiation. The susceptibility to water penetration of the coating due to the presence of the stabilizer, is also affected by the monomer to polymer ratio.

Furthermore, it is believed that the presence of the partially water soluble stabilizer compound in the hydrophobic resin, plays a key role in facilitating relatively rapid water penetration through the non-image regions while having little or no such facilitating effect in the cross linked, image regions. Although the coating and/or the substrate can include a more highly water soluble material, for accelerating the release of the non-imaged coating regions, it is believed that the window of effectiveness for commercial use requires a significant presence of the partially water soluble material, which can be balanced off against a lesser presence of full water soluble material. Moreover, the partially soluble material for implementing the present invention, can play a dual role in the coating, e.g., an optimized presence of a partially water soluble polymerization initiator or a radiation sensitive dye, may not require a separate partially water soluble stabilizer.

The term "stabilizer" as used herein, connotes a material that is soluble in the non-aqueous solvent for the resin, but also has partial solubility in water. Solubility in the solvent means that the material is substantially homogeneously distributed in the resin and monomer of the coating liquid as it is applied onto the substrate. In the dried coating the stabilizer can also provide the function of enhancing the shelf life, in addition to effectuating the penetration of water to the substrate during post-image processing. This is another aspect of the feature described above, wherein it is not always necessary to have a distinct stabilizer material apart from the other constituents; some constituents can play a dual role if they exhibit an effective degree of partial water solubility.

Further optimization can trade off the presence of one or more water-soluble release accelerators or agents, as to one or both of the coating and a subcoating on the substrate. Also, whether a plate was top coated with an aqueous solution can affect the efficiency of water penetration for a given coating composition.

Another optimization can be obtained by utilizing co-initiators, such as a combination of triazine and a smaller amount of an organo-borate compound.

In yet another embodiment, a thermally imageable negative working plate having a coating according to the improvements previously described herein, can be exposed to heat for a short period of time after imaging, such that the imaged portions become more stable and tougher, while the portions of the coating that are to be removed are not significantly affected. This thermal enhancement step increases the difference in removability between the imaged and non-imaged regions. The heating step preferably, but not necessarily, immediately follows the imaging step, and can be at a different location from the imaging step.

DESCRIPTION OF THE PREFERRED EMBODIMENTS

Printing Press Process

Figure 1:
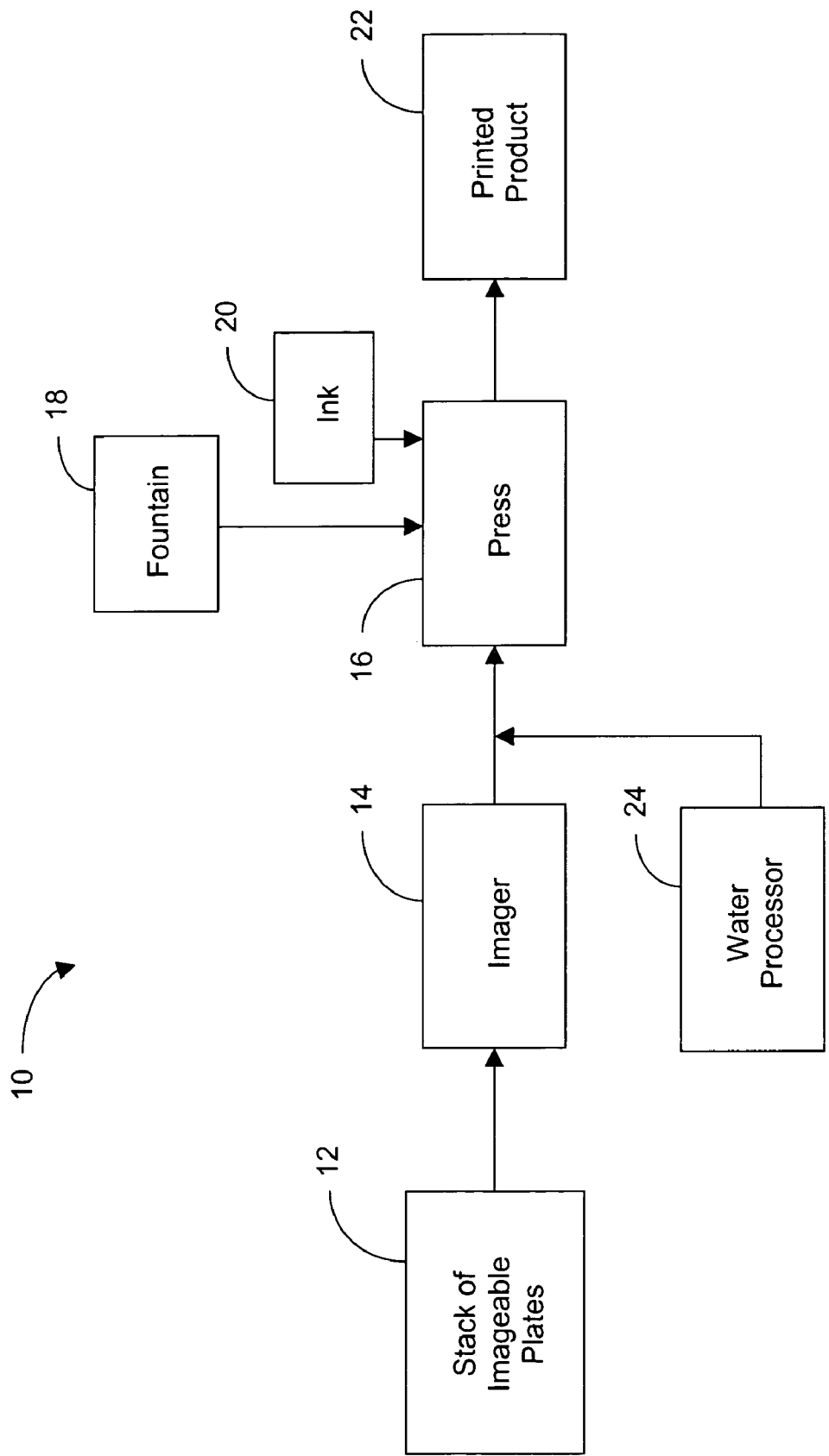
FIG. 1 schematically shows a printing system comprising plate stack, imager, and press.

FIG. 1 shows a schematic of a printing plant 10, such as for newspaper printing, in which a stack of radiation imageable plates 12 is situated upstream of an imager 14, where the coating on the plates is selectively highly cross linked by selective exposure to radiation to form a pattern of highly cohesive and adhesive regions, and regions that exhibit less cohesion and adhesion. The plate substrate is hydrophilic, whereas the coating is oleophillic. The radiation exposure produces the high cohesion, and adhesion to the plate. In a conventional negative working system, the original (non-imaged) coating is soluble in a specified developer solution, so the imaged plate must be developed to remove the non-exposed regions and thus produce a plate usable in the press. The developer solutions used most often contain either some amount of a solvent (typically benzyl alcohol) or have an elevated pH (alkaline).

Unlike conventional systems, in the present invention the imaged plates can be delivered directly to the press 16, where exposure to fountain fluid 18 "develops" the plates on-press, by quickly dislodging the non-image regions to reveal the underlying substrate, which has an affinity for fountain fluid, and retaining the imaged regions, which have an affinity for ink. The immersion of the plate in fountain fluid and the contact of the wet plate with the blanket in the press removes the non-imaged regions without a distinct developing step, and without the need for monitoring or intervention of any type. The resulting printing plates can be run in the conventional manner to produce the printed product, which is output at 22.

As an optional configuration, the imaged plates may be sent to a water processing station 24, where no special treatment is required other than contact with pH neutral water (e.g., tap water) for a period typically in the range of about 10-60 seconds. The non-imaged regions quickly become susceptible to removal by simple wiping, ultrasound cleaning, or pressurized water spraying. A suitable spray can be achieved with a nozzle pressure in the range of 100-300 psi, directing a fan pattern about 6-12 inches wide at a distance of about 6-12 inches from the plate. This wiping can be achieved as part of or immediately after the water processing at 24. The plates can then be dried and stacked, before a fully processed plate is sent to the press 16. Optionally, the plates may be subjected to a gumming step (typically with a gum Arabic solution) prior to mounting on press. This is a well known practice in the printing industry, and is especially preferred if the plate will not be placed on press immediately after development.

It is well known in this art, that fountain fluid can have a range of pH and include other additives such as surfactants and the like for optimizing the operation of the press or the quality of the product. With the present invention, the fountain fluid can be pure water, or water with additives to improve the printing process, but no solvent or pH adjustment is needed for removing the non-imaged regions of the plate, whether the plate is delivered to the press directly from the imager 14, or first subjected to water developer 24 upstream of the press.

The most evident advantage of the foregoing process, is that no separate developing equipment or step is required between the imager 14 and the press 16. A second significant advantage, whether or not the plate is passed through a water processor 24, is that little or no chemical treatment is required of the waste stream associated with developing the plate. Not only is the fresh developer fluid non-toxic and non-reactive, but in a surprising discovery, little or none of the coating removed from the non-exposed regions of the plate is dissolved or dispersed into the process water. Rather, all or most of this coating detaches from the substrate in sufficiently large pieces that can be readily removed by filtration and relatively easily disposed of.

Imageabale Plate

Figure 2:
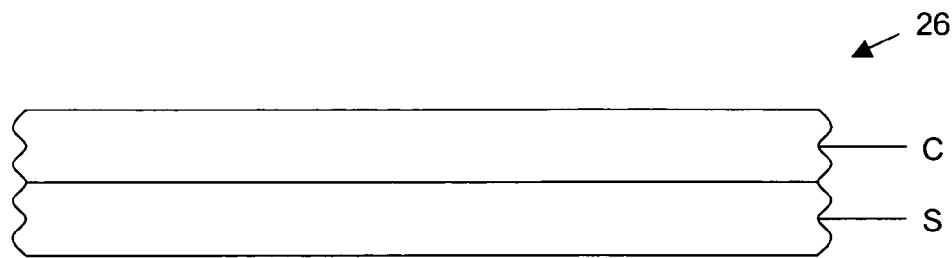
FIG. 2 is a schematic plate cross section showing an imageable coating directly supported on a substrate.

FIGS. 2-6 illustrate schematically, the physical attributes of a plate according to the present invention. FIG. 2 is a schematic section view of the basic embodiment 26, consisting of a substrate or carrier S on which an organic, solvent-based coating C has been applied and dried. The substrate S is preferably a grained, anodized aluminum sheet. The substrate is further preferably post treated with a hydrophilizing agent prior to coating. Such post treatments are well known in the art, and include silicate solutions, polyvinylphosphonic acid (PVPA) or amino trimethylenephosphonic acid (ATMPA). The coating C is applied from a solvent soluble composition comprising one or more components capable of cross linking by free radical polymerization. The polymerization arises as a result of imaging with ultraviolet, visible or infrared radiation. As such, the coating may further comprise radiation absorbers and/or initiators to facilitate the cross linking efficiency. The coating of the present invention further comprises a solvent soluble, partially water soluble component that enables the coating to be removable by water in the non-cross linked areas. Preferred coating compositions further comprise a polymeric material to enhance the oleophillicity and durability of the coating in the ink receptive printing areas.

Figure 3:
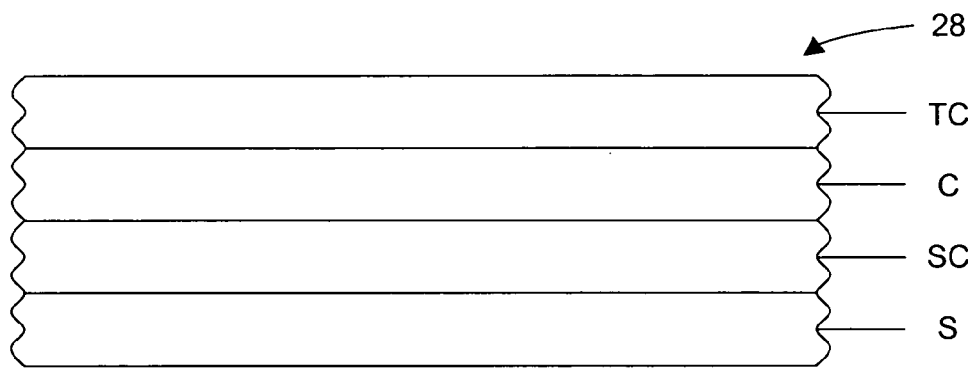
FIG. 3 is a schematic plate cross section showing an imageable plate with a subcoat and top coat.

FIG. 3 is a schematic section view of a plate according to an alternative embodiment where a subcoating SC has been applied to the substrate S, the imageable coating C is applied over the subcoating, and a topcoat TC is applied over the imageable coating. The top coat TC is typically a water soluble film forming layer such as polyvinyl alcohol (PVOH) that serves to prevent atmospheric oxygen from diffusing into the coating and quenching the free radicals. Without the topcoat, the polymerization efficiency is dramatically decreased. The subcoat SC is a water soluble material that facilitates the release of the coating from the substrate in the non-imaged areas. The subcoat SC must not adversely impact the adhesion of the coating to the substrate in the imaged areas of the coating. 4-hydroxybenzene sulfonic acid, sodium salt has been found to be particularly suitable as a subcoat.

Figure 4:
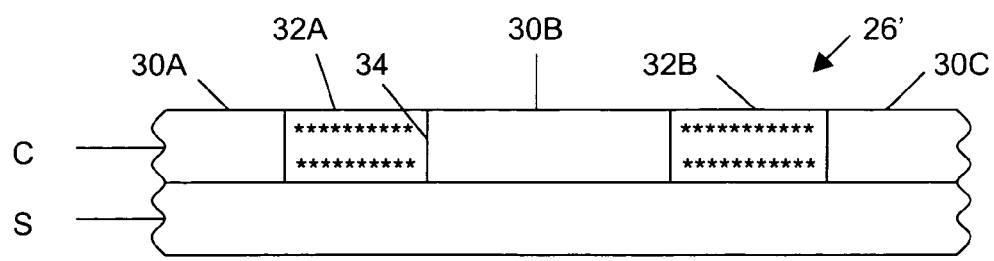
FIG. 4 is a schematic plate cross section upon exposure to radiation.

FIG. 4 corresponds to FIG. 2, and illustrates the effect on the coating of exposure to imaging radiation. The radiation source is preferably a digitally controlled laser, which produces exposure pixels such that a pattern of unexposed coating 38*a*, 30*b*, and 30*c* and exposed coating 32*a* and 32*b* covers substantially all of the plate. However, any of the sources of incident imaging radiation used in the art to form selectively written surfaces can be used in the present invention. The selective imaging results in relatively distinct boundaries 34 at the interface between the imaged and non-imaged regions. It should be appreciated that FIGS. 2-6 are not to scale, especially as to relative thickness of the coating and substrate, but are merely illustrative. For the illustrated negative working plate, the exposed coating in regions 32*a*, 32*b* becomes cross linked, thereby creating regions that have sufficient cohesion and adhesion such that they are not removable by subjecting these areas to water processing. While not being bound by any specific theory, it is believed that the cross linking creates a matrix which is less permeable to water penetration, and thus these areas of the coating are not undermined when subjected to treatment with water or fountain solution. The unexposed regions 30*a*, 30*b*, and 30*c* retain the original characteristics and properties of the dried coating before imaging. This material is not cross linked, and the coating lacks the cohesive or adhesive integrity to withstand the undermining action of the water or fountain solution.

In a conventional developing process, the developer is typically one of two primary types. One type is a developer that contains some level of a solvent, most typically benzyl alcohol. This type of developer is very common for negative working UV plates. The second type of developer is a high pH composition containing typically alkali silicate and/or alkali hydroxide. This type of developer is widely used for positive working thermal plates. The developer dissolves or disperses the unexposed regions 30*a*, 30*b*, and 30*c*, leaving only the exposed regions 32*a*, 32*b*. According to the present invention, the regions 30*a*, 30*b*, and 30*c* can be removed as a result of immersion or spraying with water, and the wiping away of the non-imaged regions.

Figure 5:
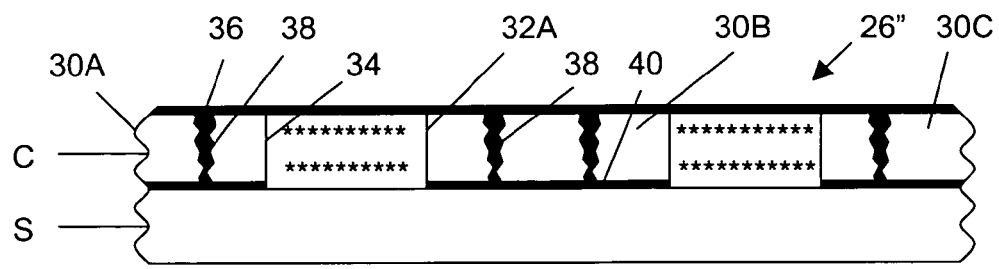
FIG. 5 is a schematic plate cross section showing water penetration through the non-imaged regions of the coating.

FIG. 5 illustrates the likely mechanism by which such removal occurs. The presence of water on the plate coupled with the partial solubility of the non-polymerizable organic compound (stabilizer) in the coating, produces paths 38 in the non-imaged regions for the water to penetrate the surface. It is believed that fissures or the like form in the coating, enabling the film or layer of water 36 on the surface of the coating to penetrate the coating, for example by one or more of seepage, percolation, or diffusion. The penetration of the coating through fissures is indicated generally at 38. The water appears to penetrate to the surface of the substrate, where it may spread laterally under the coating, as indicated at 40. Because the coating as applied and then dried does not strongly adhere to the substrate, and has not been cross linked during imaging to anchor in the rough texture on the grained surface of the substrate, the water penetration at 40 facilitates the release of the coating from the substrate. Mere wiping by a cloth or the like, or by the friction of a blanket roll against a mounted plate in the press, dislodges and removes the non-imaged regions. As an alternative to wiping to remove the coating, it is also possible to utilize an ultrasonic immersion to dislodge the less cohesive, non-cross linked coating. As a further alternative, it has been found that a water spray provided with a sufficient spray pressure is suitable for removing the non-cross linked areas without additional wiping.

Figure 6:
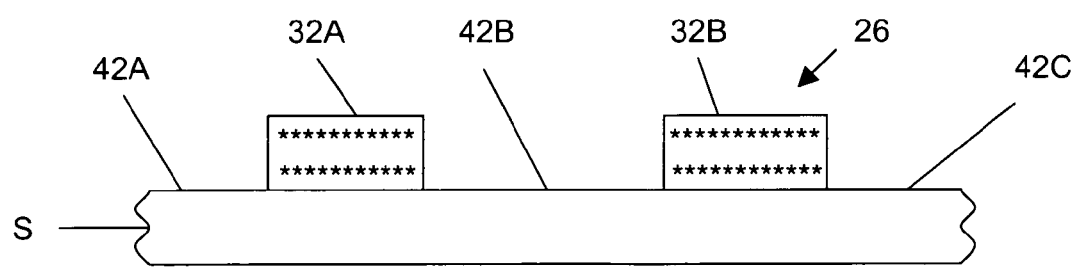
FIG. 6 is a schematic plate cross section showing removal of non-imaged regions of the coating.

FIG. 6 shows the resulting plate 26 ready for production on press with regions 32a and 32b representing the oleophillic coating that picks up ink from the inking rollers for transfer of the image to a transfer blanket or direct to the medium being printed, and 42a, 42b, and 42c representing the hydrophilic substrate surfaces that will carry the fountain solution on press. It is to be understood that the plates and process described herein are essentially planographic and, as noted above, the relative thickness of the regions and surfaces shown in the figures should not be considered as in scale.

One significant advantage arising from the present invention is that the non-imaged area of the plate will have less tendency to retain ink receptive coating residue than a conventionally developed plate. With conventional development, the coating must be completely dissolved and removed in the developing step. It is sometimes problematic to ensure that all coating is removed from the interstices of the substrate grain. Any residual will remain during the printing process and cause some level of ink pick-up in the background. With the present invention, the coating in the background areas is not adhesively bound to the substrate, and is removable by the press. Any residual coating will tend to be removed during the printing start-up, resulting in a cleaner background.

Another significant advantage of the present invention is that the integrity of the imaged coating is not adversely affected by the processing liquid, i.e., water or fountain fluid. For conventional plates, the imaging process causes a change in the solubility of the coating in the developer. The change is never 100% efficient; that is, even the imaged coating will have some level of solubility in the developer. This residual solubility may significantly alter the adhesive and/or cohesive integrity of the coating. The present invention does not suffer from this problem. This will be illustrated in the examples described herein.

Direct Coating of Representative Embodiment

In one particular embodiment of the invention having the basic configuration shown in FIG. 2, the coating comprises from about 5 to about 30 wt % based on solids content, of a polymer that is generally considered by practitioners of applied chemistry, as insoluble in water. The polymer material may be selected from a wide range of types such as but not limited to acrylates, siloxanes, and styrene maleic anhydrides.

Advantageously, the coating comprises from about 35 to about 75 wt % based on solids content, of a polymerizable monomer, a polymerizable oligomer, or combination thereof, that is similarly insoluble in water. Some suitable radically polymerizable (cross linkable) materials are a multifunctional acrylate such as Sartomer 399 and Sartomer 295 commercially available from Sartomer Co.

The coating comprises an initiator system capable of initiating a polymerization reaction upon exposure to imaging radiation. Some suitable initiator systems comprise a free radical generator such as a triazine or an onium salt.

Advantageously, the coating comprises from about 5 to about 15 wt % based on solids content of a "stabilizer" that is soluble in organic solvents and only partially soluble in water. Some suitable stabilizers include a substituted aromatic compound, such as DTTDA (an allyl amide derived from tartaric acid) and tetra methyl tartaramide.

Additional optional components include dyes that absorb the imaging radiation (e.g. infrared absorbing dyes) and pigments or dyes that serve as colorants in the coating.

The coating advantageously comprises a "release agent" such as 4-hydroxybenzene sulfonic acid, sodium salt 4-HBSA, 4-hydroxybenzoic acid or sodium benzoate. In a different embodiment the release agent is disposed as a sub-coating between the hydrophilic substrate and the imageable coating.

Physical Transformation of Coating

Figure 7:
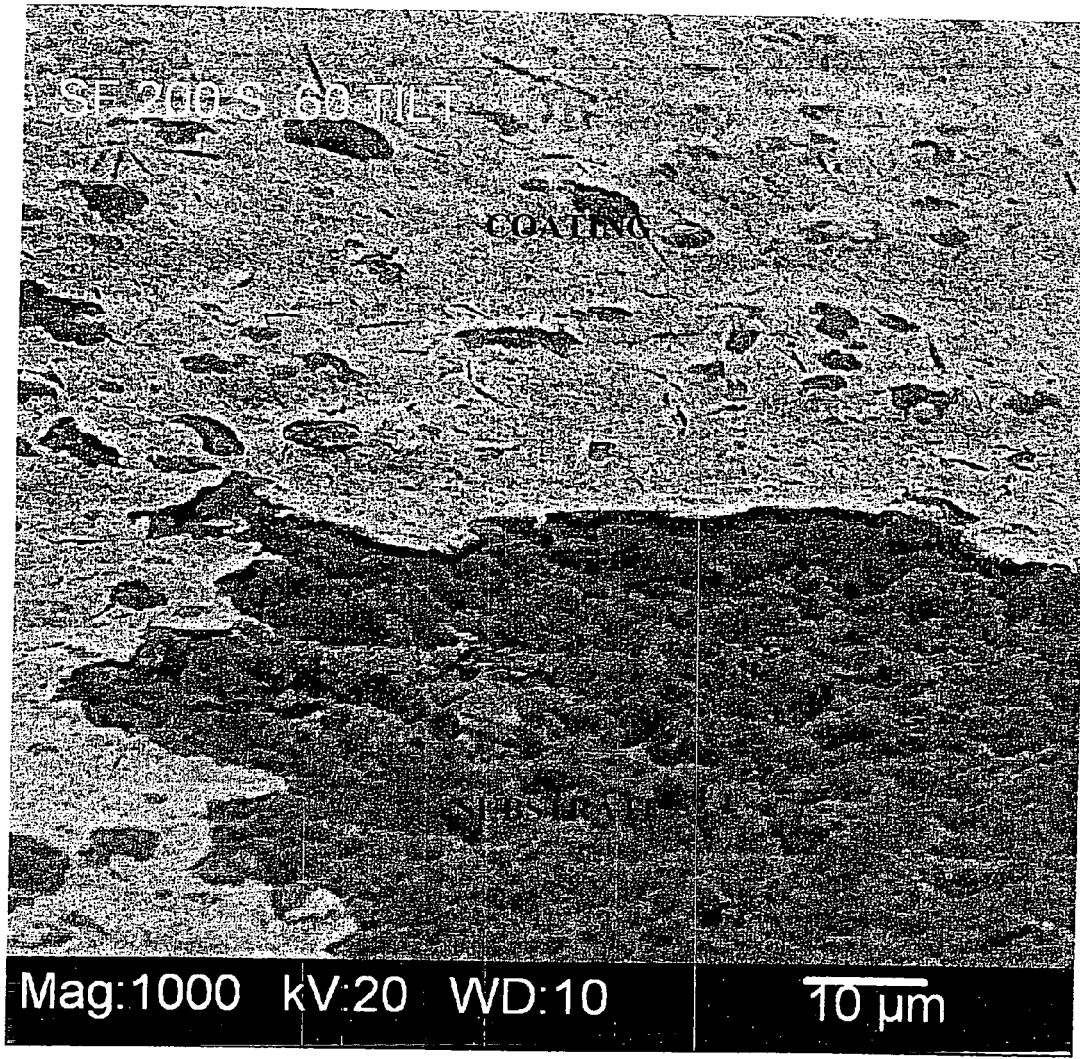
FIG. 7 is a scanning electron photomicrograph of an imaged coating formulated according to the invention, on a hydrophilic substrate after imaging exposure and development with a conventional developer.

FIG. 7 is a scanning electron photomicrograph of an imaged coating on a hydrophilic substrate after exposure and development with a conventional developer. The developer was Anocoil Corporation's commercially available S Developer, which comprises an aqueous solution of benzyl alcohol. The coated areas that were not imaged have been removed by the developer to reveal the hydrophilic substrate. The imaged coating remains on the plate, but it is clear that the coating adhesion has been significantly compromised by the developer.

Figure 8:
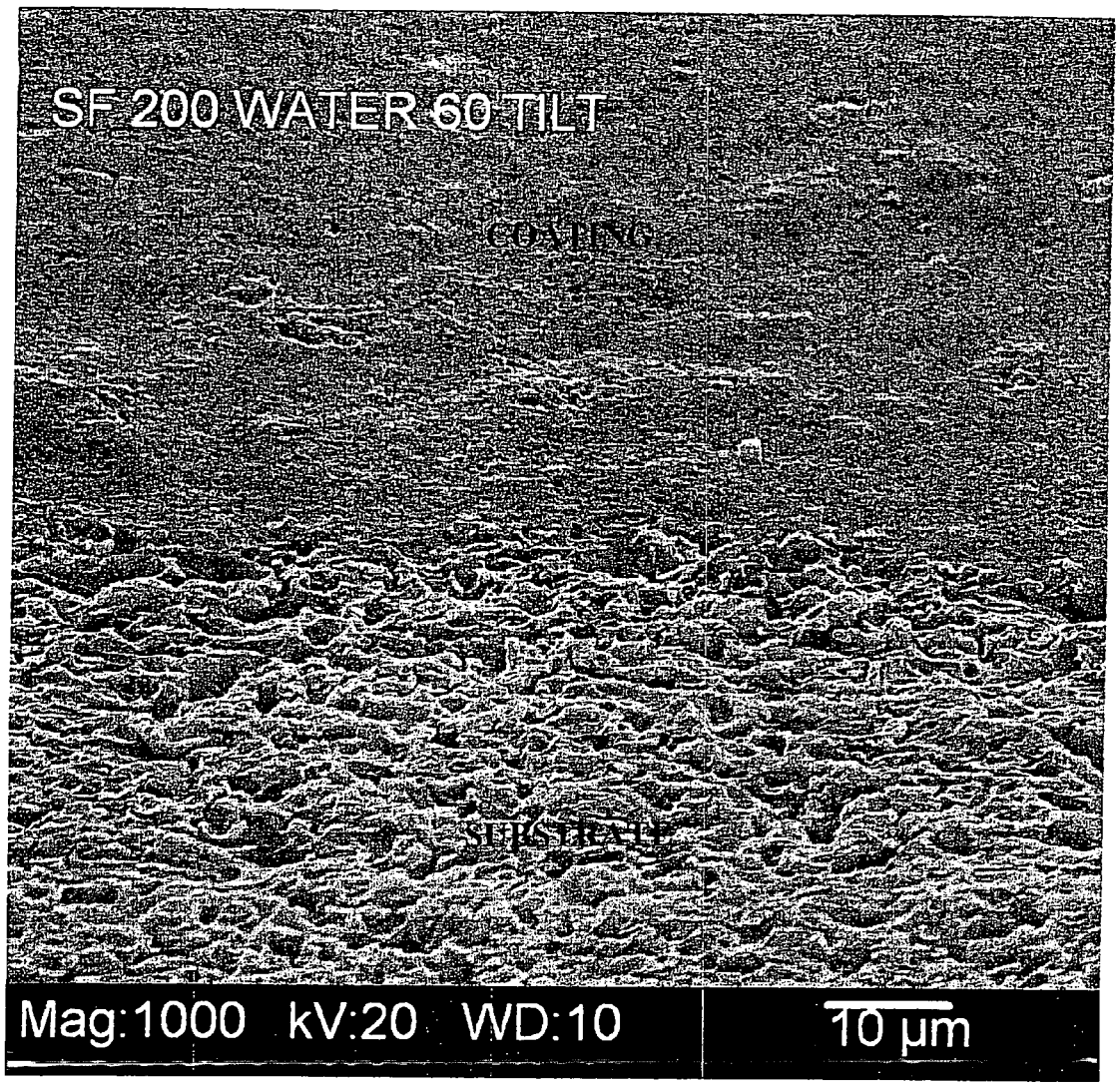
FIG. 8 is a scanning electron photomicrograph of an imaged coating having the same formulation as the coating of FIG. 7, on a hydrophilic substrate after exposure and processing with water according to the present invention.

FIG. 8 is a scanning electron photomicrograph of an identical imaged coating on a hydrophilic substrate after exposure and processing with water according to the present invention. Again the non-imaged areas of the coating have been removed to reveal the hydrophilic substrate. However, it can clearly be seen that the imaged areas of the coating that remain after processing are firmly adherent to the substrate.

The difference in adhesion of the imaged coating to the substrate can be demonstrated by a simple test using an adhesive tape. The tape is pressed by hand onto the developed coated areas for the plate of FIG. 7. The tape is subsequently pulled with a quick, smooth motion to remove it from the plate. A majority of the coating is removed from the plate surface, and becomes adhered to the tape. In contrast, when the identical test is administered to the coated areas for the plate of FIG. 8, there is little to no coating removal by the tape. This is a significant advantage of the product prepared according to the present invention.

It is believed the fissures alone do not undermine the integrity of the non-imaged regions. Only after water at the surface penetrates through the coating to the substrate, does the adhesion deteriorate to the extent that the coating can be easily dislodged. The solubility of the stabilizer should be substantially 100% in the non-aqueous solvent used to formulate the imageable coating, but only partially soluble in water, preferably less than about 15%. As an example, if the stabilizer content in the coating is in the range of 5-15 wt % and the solubility of the stabilizer is 10%, the overall solubility of such (pre-imaged) coating is about 0.5-1.5 wt %. The water solubility must not be so great as to overcome the hardening of the imaged regions and compromise the ability of these areas to remain on the plate after water processing. The water solubility must be sufficient to facilitate the penetration through the non-imaged regions.

Coating Chemistry

The following tables contain descriptions of the coating constituents and variations in the percentage content, associated with multiple examples. In each instance, the plates were prepared in a conventional manner in a laboratory, with conventional coating weight of 100 mg/sq. ft., drawn down with a wire wound stainless steel rod, and dried for two minuets at 90° C. All plates had a topcoat of PVOH at 140 mg/sq. ft. All plates having triazine were imageable with UV, and all plates with a dye sensitive to 830 nm light source, such as the KF-1151, were imageable with IR. The results reported with each table are based on conventional IR imaging at about 90-100 mj/sq. cm. A dash in a column indicates that the wt % value is the same as the entry in the previous column of the same row.

A coating formulation for a basic plate that contains a polymer, a monomer, a radically polymerizable monomer, an initiator system capable of generating radicals, and a DTTDA stabilizer can readily be produced, for processing with only water or fountain fluid. The strong wiping action of the press roll against the plate facilitates such removal.

If the plates are to be processed in a dedicated station upstream of the press by immersion in water and a wiping action milder than what a plate experiences on-press, the stabilizer could be augmented by a release agent, as shown in Table 1. Plate #4 of Table 1, in which the coating had 0.40 wt % DTTDA stabilizer and 0.12 wt % 4-HBSA release agent, exhibited the best results.

Table 2 shows that for a given polymer (Clar. Poly 123) and monomer (Sartomer 399) combination, the relative weight percent is a significant variable. Ratios of monomer to polymer in the range of at least about 1:1 to about 5:1 are likely to work well, given that the ratio of 0.5:1 (Plate #4) produced only fair results, the ratio of 4:1 (Plate #3) produced excellent results, and the ratio of about 9:1 (Plate #2) produced only fair results.

Table 3 shows the result that satisfactory plates can be made from polymer resins that do not necessarily have a reaction to radiation exposure. The coatings of Plates #1 and #3 have reactive resins that produced good results, and the coatings of Plates #4 and #5 have non-reactive resins that produced good to fair results. The potential for use of non-reactive resins opens the door for use of resins having a much higher molecular weight than presently used resins.

Table 4 demonstrates that not all monomers at a given weight percent of the coating, produce equivalent results, with some producing poor results. Similarly, Table 5 demonstrates that potential stabilizers other than DTTDA that are soluble in the non-aqueous solution and are partially soluble in water, do not necessarily produce satisfactory results.

Table 6 demonstrates that potential release agents other than 4-HBSA that are fully soluble in both non-aqueous solutions and water can be successfully utilized.

Table 7 demonstrates that a coating that is sensitive to both UV and IR radiation can be successfully imaged and processed in water according to the invention.

Table 8 demonstrates that good results do not depend on use of only one kind of initiator.

Table 9 shows that the use of coinitiator compounds and/or post-imaging heating, can improve the performance of the plates.

In Table 9 the organo-borate compound is P3B, made by Showa Denko K.K., headquartered in Tokyo, Japan. The P3B can be used as the sole initiator. It is believed that used individually, the listed initiators would rank from strongest to weakest as Diphenyl Iodonium hexaflouro phosphate, Triazine AC, and P3B. The reason for using a coinitiator system rather then increasing a single initiator is that there is a synergistic effect between the organo-borate and either the triazine or onium catalyst. Given a fixed amount of energy the initiators individually (at their optimum level) will only produce a certain amount of free radicals. However, when the organo-borate is combined with one of the other catalysts, free radicals are generated at a faster rate by the triazine or onium catalyst while free radicals are still generated (at a normal rate) from the organo-borate. Therefore the efficiency of the system is increased in both rate and population. By using this combination, a much higher degree of cross-linking is realized, which improves both adhesion and cohesion of the image. With an increase in adhesion and cohesion, an increased amount of release agent can be used, thereby providing for better development.

Depending on the type of equipment used for the post-imaging thermal enhancement, a different range of times and temperatures should be used. With a convection oven, both the temperature and dwell time are greater than with a small preheat oven unit (where the plate comes in direct contact with the heating element). As a rough guide, 200 deg. F. at 1 minute in a convection oven has approximately the same effect as 175 deg. F. for 7 seconds in a preheat oven. With a typical commercially available preheat unit, the window would be 175 to 250 deg. F. for a time period of 5 to 15 seconds.

Tests were also run on the six formulations shown in Table 9, for comparison of UV versus IR exposures. Previous formulations which did not contain the organo-borate co-initiator system were UV sensitive only when they contained the Triazine AC. The onium salt by itself was not UV sensitive. Incorporating the organo-borate into the formulation rendered the formulations that contained the onium salt UV sensitive. All six of the formulations that contained the co-initiator system produced a good image when exposed to either IR or UV. In order to simplify the testing formulation #5 was chosen for testing in UV exposures.

Using an Ugra scale for comparison, plates were exposed for 250, 125 and 62.5 mjs. The plates were then developed through a water bath with two molleton socks at 4 feet per minute at 75 degrees F. The resulting step wedges were 250 mj—solid 9 steps with 2 gray steps to a total of 11, 125 mj—solid 7 steps with 2 gray steps to a total of 9 and 62.5 mj—solid 5 steps with 2 gray steps to a total of 7. All of the images from the different exposures exhibited very good solvent resistance. The best resolution that was received was at 62.5 mjs, which yielded an open 15 micron line target and good screen values from 2% to 99%.

TABLE 1

Coating Compositions With Partially Water Soluble Stabilizer As the Significant Variable
4-Hydroxy B S A and DTTDA

|  | #1 | #2 | #3 | #4 | #5 | #6 |
|---|---|---|---|---|---|---|
| Meth. Prop [a] | 92.39% | 91.99% | 92.27% | 91.77% | 91.77% | 91.77% |
| Sartomer 399 [b] | 2.31% | 2.31% | 2.31% | 2.31% | 2.31% | 2.31% |
| Clariant Poly 123 [c] | 0.46% | 0.46% | 0.46% | 0.46% | 0.46% | 0.46% |
| Triazine AC [d] | 0.45% | 0.45% | 0.45% | 0.45% | 0.45% | 0.45% |
| DTTDA [e] | 0.00% | 0.40% | 0.00% | 0.40% | 0.52% | 0.00% |
| 4-HBSA [f] | 0.00% | 0.00% | 0.12% | 0.12% | 0.00% | 0.52% |

TABLE 1-continued

Coating Compositions With Partially Water Soluble Stabilizer As the Significant Variable
4-Hydroxy B S A and DTTDA

|  | #1 | #2 | #3 | #4 | #5 | #6 |
|---|---|---|---|---|---|---|
| KF-1151 [g] | 0.05% | 0.05% | 0.05% | 0.05% | 0.05% | 0.05% |
| Pigment Disp [h] | 4.34% | 4.34% | 4.34% | 4.34% | 4.34% | 4.34% |
|  | 100.0% | 100.0% | 100.0% | 100.0% | 100.0% | 100.0% |

[a] Solvent (1-Methoxy-2-Propanol, Propylene Glycol Methyl Ether available from Arco Chemical Company)
[b] Monomer (Dipentaerythritol Monohydroxypentaacrylate available from Sartomer Company, West Chester, Penn.)
[c] Polymer
[d] Initiator
[e] Stabilizer
[f] Release Agent
[g] Dye
[h] Pigment RESULTS
1 Plate would not develop
2 Plate showed slight signs of development
3 Plate had partial development with heavy redeposition
4 Plate developed very easily producing an image with good adhesion, good dot reproduction and a clean background.
5 Plate did not develop any better then plate #2
6 Plate developed in a very non uniform way yielding a weak image and redeposition

TABLE 2

Coating Compositions Monomer/Polymer Ratio as the Significant Variable
Monomer/Polymer Ratio

|  | #1 | #2 | #3 | #4 | #5 | #6 |
|---|---|---|---|---|---|---|
| Meth. Prop. | 92.39% | — | — | — | — | — |
| Sartomer 399 | 2.77% | 2.49% | 2.21% | 1.85% | 0.92% | 0.00% |
| Clar. Poly 123 | 0.00% | 0.28% | 0.56% | 0.92% | 1.85% | 2.77% |
| Triazine AC | 0.45% | — | — | — | — | — |
| DTTDA | 0.40% | — | — | — | — | — |
| 4-HBSA | 0.12% | — | — | — | — | — |
| KF-1151 | 0.05% | — | — | — | — | — |
| Pigment Disp. | 4.34% | — | — | — | — | — |
|  | 100.0 | 100.0 | 100.0 | 100.0 | 100.0 | 100.0 |

Results:
1 Plate produced a good image but the plate was easily over developed. The coating was slow in speed and had poor adhesion to the substrate.
2 Produced a better image then #1 with faster speed but it was still easy to over develop but with better adhesion.
3 Produced a strong image with good adhesion. The coating developed very easily with good dot reproduction and clean background.
4 Produced a very strong image with great adhesion. The coating was more difficult then #3 to develop but had good dot reproduction and a clean background. There was also some evidence of redeposition.
5 Plate showed only very slight development.
6 Plate had no development.

TABLE 3

Coating Compositions With Radiation Sensitive Resin As the Significant Variable
Reactive and Non Reactive Resins

|  | #1 | #2 | #3 | #4 | #5 | #6 |
|---|---|---|---|---|---|---|
| Meth. Prop. | 92.39% | — | — | — | — | — |
| Sartomer 399 | 2.21% | — | — | — | — | — |
| Triazine AC | 0.45% | — | — | — | — | — |
| DTTDA | 0.40% | — | — | — | — | — |
| 4-HBSA | 0.12% | — | — | — | — | — |
| KF-1151 | 0.05% | — | — | — | — | — |
| Pigment Disp. | 4.34% | — | — | — | — | — |
| Clar. Poly 123 | 0.56% | — | — | — | — | — |
| Jaylink 106 | — | 0.56% | — | — | — | — |
| NK-P1002 | — | — | 0.56% | — | — | — |

TABLE 3-continued

Coating Compositions With Radiation Sensitive Resin As the Significant Variable
Reactive and Non Reactive Resins

|  | #1 | #2 | #3 | #4 | #5 | #6 |
|---|---|---|---|---|---|---|
| Dow Corning 62230 | — | — | — | 0.56% | — | — |
| Sartomer PRO5542 | — | — | — | — | 0.56% | — |
| 4-vinylphenol/MMac. | — | — | — | — | — | 0.56% |
|  | 100.0 | 100.0 | 100.0 | 100.0 | 100.0 | 100.0 |

Results:
1 Produced an image with good dot reproduction and adhesion along with a clean background. Coating was easy to develop.
2 Coating was difficult to develop and produced a broken image with poor adhesion. The background of the plate was clean.
3 The coating was slightly more difficult to develop then #1 but produced an image with good adhesion but significant coating re-deposited on the image. The background area of the plate was clean.
4 This resin (non photo reactive) produced a coating that was easy to develop. The image had good dot reproduction and good adhesion. The image was prone to over development. The background areas of the plate were clean.
5 This resin (non photo reactive) produced a coating that was easy to develop without being over sensitive. The image had good dot reproduction and good adhesion. The background areas of the plate were clean.
6 This resin (non photo reactive) produced a coating that was very difficult to develop. Could not get good dot reproduction or a clean background.

TABLE 4

Coating Compositions Monomer Type as the Significant Variable
Monomers

|  | #1 | #2 | #3 | #4 | #5 | #6 |
|---|---|---|---|---|---|---|
| Meth. Prop. | 92.39% | — | — | — | — | — |
| Clar. Poly 123 | 0.28% | — | — | — | — | — |
| Triazine AC | 0.45% | — | — | — | — | — |
| DTTDA | 0.40% | — | — | — | — | — |
| 4-HBSA | 0.12% | — | — | — | — | — |
| KF-1151 | 0.05% | — | — | — | — | — |
| Pigment Disp. | 4.34% | — | — | — | — | — |
| SR-399 | 2.49% | — | — | — | — | — |
| SR-454 | — | 2.49% | — | — | — | — |
| SR-350 | — | — | 2.49% | — | — | — |
| SR-295 | — | — | — | 2.49% | — | — |
| CD-580 | — | — | — | — | 2.49% | — |
| SR-348 | — | — | — | — | — | 2.49% |
|  | 100.0 | 100.0 | 100.0 | 100.0 | 100.0 | 100.0 |

Results:
1 (SR-399 Dipentaerythritol Pentaacrylate) This monomer produced a coating that was easy to develop. The image was strong with good dot reproduction and good adhesion. The background area was very clean. The image was slightly sensitive to overdevelopment.
2 (SR-454 Ethoxylated Trimethylolpropane Triacrylate) This monomer produced a coating that was very easy to develop but had a weak image and a dirty background.
3 (SR-350 Trimethylolpropane Triacrylate) This monomer produced a coating that was somewhat difficult to develop. The resulting image was strong but with heavy retention in Background.
4 (SR-295 Pentaerythritol Triacrylate and Tetraacrylate) This Mixture of monomers produced a coating that was almost as easy as #1 to develop. The image was slightly weaker then #1 but the background was clean.
5 (CD-580 Alkoxylated Cyclohexane Dimethanol Diacrylate) This monomer produced a coating that did not develop.
6 (SR-348 Ethoxylated Bisphenol A Dimethacrylate) This monomer produced a coating that was very difficult to get any development.

TABLE 5

Coating Compositions With DTTDA and other Partially Soluble Stabilizers As the Significant Variable
DTTDA and Analogous Compounds

|  | #1 | #2 | #3 | #4 | #5 | #6 |
|---|---|---|---|---|---|---|
| Meth. Prop. | 92.39 | — | — | — | — | — |
| Sartomer 399 | 2.31 | — | — | — | — | — |
| Clar. Poly 123 | 0.46 | — | — | — | — | — |
| Triazine AC | 0.45 | — | — | — | — | — |
| 4-HBSA | 0.12 | — | — | — | — | — |
| KF-1151 | 0.05 | — | — | — | — | — |
| Pigment Disp. | 4.34 | — | — | — | — | — |
| DTTDA | 0.40 | — | — | — | — | — |
| Dimethyl Tartrate | — | 0.40 | — | — | — | — |
| Di allyl Maleate | — | — | 0.40 | — | — | — |

TABLE 5-continued

Coating Compositions With DTTDA and other Partially Soluble Stabilizers As the Significant Variable
DTTDA and Analogous Compounds

|  | #1 | #2 | #3 | #4 | #5 | #6 |
|---|---|---|---|---|---|---|
| Di allyl Succinate | — | — | — | 0.40 | — | — |
| Dimethyl Maleate | — | — | — | — | 0.40 | — |
| Tetra Methyl Tartaramide | — | — | — | — | — | 0.40 |
|  | 100.0 | 100.0 | 100.0 | 100.0 | 100.0 | 100.0 |

Results:
1 Good development, good image and clean background.
2 Hard to develop, strong image and dirty background.
3 Very slight development.
4 No development
5 No development
6 As good as #1

TABLE 6

Coating Compositions With 4HBSA and Other Soluble Release Agents As the Significant Variable
4-Hydroxy B.S.A. and Analogous compounds

|  | #1 | #2 | #3 | #4 |
|---|---|---|---|---|
| Meth. Prop. | 92.39 | — | — | — |
| Sartomer 399 | 2.31 | — | — | — |
| Clar. Poly 123 | 0.46 | — | — | — |
| Triazine AC | 0.45 | — | — | — |
| DTTDA | 0.40 | — | — | — |
| KF-1151 | 0.05 | — | — | — |
| Pigment Disp. | 4.34 | — | — | — |
| 4-HBSA | 0.12 | — | — | — |
| Benzene Sul. Acid | — | 0.12 | — | — |
| 4-Hydroxy Benzoic Acid | — | — | 0.12 | — |
| Sodium Benzoate | — | — | — | 0.12 |
|  | 100.0 | 100.0 | 100.0 | 100.0 |

Results:
1 Control formula - produced a coating that was easy to develop. The image was strong and the background was clean.
2 The coating was not as easy to develop but the image was strong and the background was somewhat clean.
3 This material produced a coating that was as good or better than the control.
4 This coating was equivalent to #2.

TABLE 7

Coating Compositions With Various Infrared Sensitive Dyes As the Significant Variable
Various 830 Dyes

|  | #1 | #2 | #3 | #4 |
|---|---|---|---|---|
| Meth. Prop. | 92.39 | — | — | — |
| Sartomer 399 | 2.31 | — | — | — |
| Clar. Poly 123 | 0.46 | — | — | — |
| Triazine AC | 0.45 | — | — | — |
| DTTDA | 0.40 | — | — | — |
| 4-HBSA | 0.12 | — | — | — |
| Pigment Disp. | 4.34 | — | — | — |
| KF-1151 | 0.05 | — | — | — |
| ADS-WS | — | 0.05 | — | — |
| Few Chem S0456 | — | — | 0.05 | — |
| Few Chem S0306 | — | — | — | 0.05 |
|  | 100.0 | 100.0 | 100.0 | 100.0 |

Results:
1 This is the control coating which developed easily and produced a good image and clean background.
2 This coating was equivalent to #1 except that the image was not quite as strong.
3 This coating developed easily but did not produce any image.
4 This coating developed easily but produced a very weak image.

Observation; Although not all of the coatings produced an image in the IR all of them did produce strong images in the UV.

TABLE 8

Coating Compositions With Triazine vs. Onium Salts As the Significant Variable for Cross Linking Initiators
Initiators: Triazine Vs. Onium Salts

|  | #1 | #2 | #3 |
|---|---|---|---|
| Meth. Prop. | 92.39 | — | — |
| Sartomer 399 | 2.31 | — | — |
| Clar. Poly 123 | 0.46 | — | — |
| DTTDA | 0.40 | — | — |
| 4-HBSA | 0.12 | — | — |
| KF-1151 | 0.05 | — | — |
| Pigment Disp. | 4.34 | — | — |
| Triazine AC | 0.45 | — | — |
| Diphenyl Iod. PF6 | — | 0.45 | — |
| CD1012 | — | — | 0.45 |
|  | 100.0 | 100.0 | 100.0 |

Results:
1 This is the control formulation which was easy to develop and produced a strong image with a clean background.
2 This formula (with Diphenyliodonium Hexafluorophosphate) developed easier then the control and still produced a strong image with a clean background.
3 This formulation was slightly more difficult to develop than the control. It produced a strong image but a slightly dirty background. (Diaryliodonium Hexaflouroantimonate)

TABLE 9

Post-Imaging Thermal Enhancement and Coating Compositions with Co-Initiators

|  | #1 | #2 | #3 | #4 | #5 | #6 |
|---|---|---|---|---|---|---|
| Meth. Prop. | 91.87% | 91.77% | 91.25% | 91.87% | 91.77% | 91.25% |
| Sartomer 399 | 2.46% | 2.46% | 2.46% | 2.46% | 2.46% | 2.46% |
| Clar. Poly 123 | 0.31% | 0.31% | 0.31% | 0.31% | 0.31% | 0.31% |
| DTTDA | 0.40% | 0.40% | 0.80% | 0.40% | 0.40% | 0.80% |
| 4-HBSA | 0.12% | 0.12% | 0.24% | 0.12% | 0.12% | 0.24% |
| KF-1151 | 0.05% | 0.05% | 0.05% | 0.05% | 0.05% | 0.05% |
| Pigment Disp. | 4.34% | 4.34% | 4.34% | 4.34% | 4.34% | 4.34% |
| Showa D. 3PB | — | 0.10% | 0.10% | — | 0.10% | 0.10% |
| Triazine AC | 0.45% | 0.45% | 0.45% | — | — | — |
| Diphnly Iod. PFG | — | — | — | 0.45% | 0.45% | 0.45% |
| Total | 100.0 | 100.0 | 100.0 | 100.0 | 100.0 | 100.0 |

Results:

1a) This is a control type coating formula which developed easily and produced a good image and clean background. The run length of this image was very susceptible to press type and conditions.
1b) Using the same coating formula the plate was put through a pre-heat of 100 degrees C. for 1 minute prior to being mounted on press. The plate still had good development (slightly less then #1a) but had an image that was less susceptible to the type of press and its condition.
2a) This is the control formulation but with the addition of a small amount of an organo-borate compound (Showa D. 3PB) used as a co-initiator. This plate took longer to develop than plates 1a or 1b but had a much more durable image. This coating was much less sensitive to press type or conditions and also had better run length than 1b.
2b) Using the same coating formula as 2a the plate was put through a pre-heat of 100 degrees C. for 1 minute prior to being mounted on press. The plate was slower to develop than 2a and although the image was much tougher the background was not as clean causing the plate to print with a background tone.
3a) This coating was the same as #2 but the amount of DTTDA and 4-HBSA was doubled, which with the use of the organo-borate allowed the plate to have good development characteristics along with a good image. This made it easier to develop then 2a but it did not have as tough an image.
3b) This is coating 3a but the plate was exposed to a pre-heat of 100 degrees C. (for 1 minute) prior to being mounted on the press. This plate had a very tough image but was slower to develop then 3a and did not have a completely clean background.
4a) This is the same as formula #1 but the Triazine AC was replaced with the onium salt Diphenyl Iodonium Hexa-Flouro Phosphate. This change not only allowed the plate to develop faster on press but it also produced a slightly better image then #1 with a good clean background.
4b) This is coating 4a except the plate was exposed to a pre-heat of 100 degrees C. for 1 minute prior to mounting on press. The plate developed as fast as #1 having a strong image with good integrity. The plate had a decent run but was still somewhat susceptible to press conditions.
5a) This is the same as coating 4a except for the organo-borate. The plate produced from this coating was slower to develop than plate 4a. It had a good image with a clean background.
5b) This is coating 5a with a preheat of 100 degrees C. for 1 minute prior to mounting on press. This coating developed at approximately the same speed as 5a. The image was very strong with good integrity but the background printed with a very slight tone.
6a) This is coating formula #5 with double the amount of the DTTDA and 4-HBSA. These plates had a good roll up on press with a clean background. The image was sound but not quite as strong as #5.
6b) These plates were coated with the formula of #6 but were exposed to a pre-heat prior to being mounted on press. In the previous pre-heat trials the plates could not exceed a temperature of 100 degrees C. without either losing a clean background or loss of development altogether. With the increase in the developing aids the plates were able to take a pre-heat of 120 degrees C. for 1 minute and still maintain good development with a strong image and a clean background.

The invention claimed is:

1. An organic composition for photopolymer coating an anodized, hydrophilic substrate to form a radiation imageable lithographic printing plate comprising:
a non-aqueous solution of (a) a polymer selected from the group consisting of acrylates, siloxanes, and styrene maleic anhydrides, and one or both of a monomer that is selected form the group consisting of multifunctional acrylates and an oligomer, capable of radically cross-linking with each other when the coating is exposed to imaging radiation, (b) a non-polymerizable organic compound selected from the group consisting of N,N'-diallyltartardiamide (an allyl amide derived from tartaric acid) and tetra methyl tartaramide, and (c) a water-insoluble initiator capable of generating free radicals sufficient to initiate a polymerization reaction upon exposure to imaging radiation;
wherein the non-polymerizable organic compound is also partially soluble in water such that after imaging of the dried coating as deposited on an anodized, hydrophilic substrate, only the non-imaged coating areas are removable as dislodged material from the substrate surface by penetration of water through the non-imaged coating areas without dissolution of the as-deposited and the cross linked polymer, monomer, and/or oligomer of the coating, to form a lithographic printing plate with clearly defined image areas of cross linked coating and non-image areas of substrate surface.

2. The organic composition of claim 1, wherein the non-polymerizable organic compound has a measurable solubility in water greater than zero and less than 15%.

3. The organic composition of claim 1, wherein the wt % ratio of monomer to polymer is in the range of about 1:1 to 5:1.

4. The organic composition of claim 1, further including a release agent present in the coating at a lower wt % than the non-polymerizable organic compound, and having a higher water solubility than the non-polymerizable organic compound.

5. The organic composition of claim 4, wherein the release agent is 4-hydroxybenzene sulfonic acid, 4-hydroxy benzoic acid, or sodium benzoate.

6. The organic composition of claim 1, wherein the polymer is reactive to imaging radiation.

7. The organic composition of claim 1, wherein the polymer is not reactive to imaging radiation.

8. The organic composition of claim 1, including a cross-linking initiator selected from triazine or an onium salt.

9. The organic composition of claim 1, including a plurality of different cross linking agents.

10. The organic composition of claim 9, wherein one of the cross linking agents is an organo-borate compound.

* * * * *